United States Patent
Kumar et al.

[11] Patent Number: 6,122,710
[45] Date of Patent: Sep. 19, 2000

[54] DYNAMIC WORD LINE DRIVER FOR CACHE

[75] Inventors: Manoj Kumar; Huy Van Pham, both of Austin, Tex.

[73] Assignee: International Business Machines Corporation, Armonk, N.Y.

[21] Appl. No.: 09/024,806

[22] Filed: Feb. 17, 1998

[51] Int. Cl.[7] .................................................. G06F 12/00
[52] U.S. Cl. ........................... 711/118; 711/202; 711/203
[58] Field of Search .............................. 711/118, 3, 167, 711/202, 128, 207, 203

[56] References Cited

U.S. PATENT DOCUMENTS

| | | | |
|---|---|---|---|
| 5,353,426 | 10/1994 | Patel et al. | 711/118 |
| 5,432,918 | 7/1995 | Stamm | 711/156 |
| 5,479,641 | 12/1995 | Nadir et al. | 711/128 |
| 5,550,995 | 8/1996 | Barrera et al. | 395/403 |
| 5,553,276 | 9/1996 | Dean | 395/550 |
| 5,602,795 | 2/1997 | Sandhu | 365/230 |
| 5,640,534 | 6/1997 | Liu et al. | 395/473 |
| 5,642,326 | 6/1997 | Toshiba | 365/230 |
| 5,930,832 | 7/1999 | Heaslip et al. | 711/207 |

FOREIGN PATENT DOCUMENTS

| | | | |
|---|---|---|---|
| 1-261749 | of 0000 | Japan | G06F 12/10 |
| 4-81947 | of 0000 | Japan | G06F 12/08 |

OTHER PUBLICATIONS

IBM Technical Disclosure Bulletin vol. 22, No. 8A, Jan. 1980 "Reduction of Alpha–Induced Soft Errors in Dynamic Memories".

*Primary Examiner*—Do Hyun Yoo
*Assistant Examiner*—Nasser Moazzami
*Attorney, Agent, or Firm*—Robert V. Wilder; Anthony V. S. England

[57] ABSTRACT

A method and apparatus is provided for implementing a cache control system effective to eliminate many of the timing problems occurring in dynamic, high bandwidth cache control systems. In one exemplary embodiment, a dummy content addressable memory (CAM) cell is provided and is strategically placed on the chip layout farthest away from the cache word line driver circuit. The dummy output signal is a required input to a cache hit evaluation circuit such that premature cache hit outputs are eliminated. The dummy cell is designed to quickly discharge a cache match line and indicate a non-hit status when any address bit line produces a mismatch indication, especially for expanded bandwidth and dynamic systems where the address lines are more extensive and the system is synchronized to predetermined clock cycles. The cache system further operates in a prefetch mode to determine hits for next in-line requested addresses. The system further includes implementations for test mode, refill, ICACHE block invalidation and cache reset signal generation.

44 Claims, 8 Drawing Sheets

DYNAMIC WORD LINE DRIVER FOR CACHE

FIELD OF THE INVENTION

The present invention relates generally to digital signal processing and more particularly to a memory driver circuit configuration for managing a cache memory device.

BACKGROUND OF THE INVENTION

With the increasing number of applications for computer systems, the demand for computer systems continues to expand. To meet the increasing demand and expanding customer base, computer systems have been provided with ever increasing performance characteristics. The increasing speed of central processing units or CPUs is very apparent. However, to take maximum advantage of the faster CPUs, the other basic computer subsystems must also be constantly improved to be capable of running at the higher system speeds. Moreover, increasing application complexities have also placed greater demands on computer subsystems so that the computer systems not only run at faster speeds but also are capable of handling much more complex applications and data handling requirements.

In computer systems, cache memory subsystems have become a critical area for improvement. More specifically, wordline driver circuits, which control the memory cells in cache arrays, have not undergone many changes. In the past, wordline drivers were simple and straight forward because caches were simple and there were fewer operations implemented in the cache. With more powerful, faster and more complex microprocessors, cache subsystems and wordline driver circuits must also be improved to make optimum use of the increased CPU capabilities. For most applications, the size and speed of the cache circuitry must be improved to allow greater amounts of programming and data to be available for even faster access by the CPU in running modern complex computer applications. As bandwidths increase, however, timing problems may be created, which in some cases may be sufficiently severe to affect the reliability of the circuit. Thus, there is a need for an improved cache subsystem and cache controlling circuitry in order to provide even greater cache capabilities for modern computer system applications.

SUMMARY OF THE INVENTION

A method and apparatus is provided for implementing a cache control system effective to eliminate many of the timing problems occurring in higher bandwidth, dynamic cache control systems. In one exemplary embodiment, a dummy content addressable memory (CAM) cell is provided and is strategically placed on the chip layout farthest away from the cache word line driver circuit. The dummy output signal is a required input to a cache hit evaluation circuit such that premature cache hit outputs are eliminated. The dummy cell is designed to quickly discharge a cache match line and indicate a non-hit status when any address bit line, particularly those farthest away from the word line driver circuit, produces a mismatch indication. The methodology is especially useful in expanded bandwidth, dynamic systems where bandwidths are more extensive and the system is synchronized to predetermined and fixed duration clock cycles. The cache control system also provides a prefetch mode for determining whether next-cycle addresses are located in the cache. In a refill mode the cache control circuit transfers date into the cache from the L2 cache or the main memory or other memory storage devices. A test mode is included and functions to determine that the cache is not defective. An "I-Cache" block invalidation (ICBI) mode is implemented to perform a prefetch operation and if a "valid" bit is low, it means that the cache line or word line becomes invalid and is not used. The cache also may generate a reset signal which means that the data in the cache is invalid. When the reset signal is generated, the system CPU will not use the data.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Although the present disclosure shows isolated logic circuitry for the sake of simplicity, it is understood that the present invention is not limited to the exemplary implementations shown, but rather also includes systems in which the methodology taught herein is implemented within or as part of a single system CPU or other larger semiconductor system, chip, processor or integrated circuit. Also, in the present example, the terms "source" or "source potential" or "VDD" are used interchangeably to refer to a logic "1" or "high" level potential. Also the terms "zero level", "ground potential", or "ground" are also used interchangeably to refer to a logic "0" or "low" level potential. Further, the terms "PFET" (p-type field effect transistor) and PMOS (p-type metal oxide semiconductor) are used interchangeably in the present disclosure, as are the terms "NFET" (n-type field effect transistor) and "NMOS" (n-type metal oxide semiconductor). Signal names and circuit nodes are also used interchangeably to refer to the signal present at particular points or nodes in the circuitry as well as to the node itself.

Figure 1:
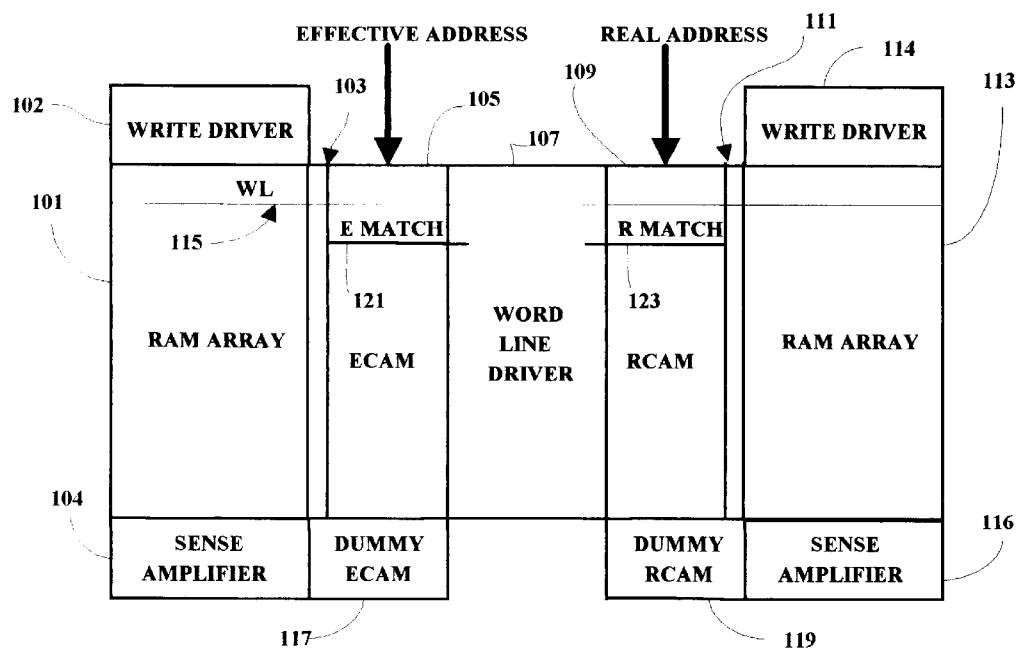
FIG. 1 is an illustration showing a portion of an exemplary chip layout including several physical areas occupied by certain ones of the chip circuits and arrays.

With reference to FIG. 1, there is shown an exemplary layout drawing illustrating certain physical areas on an integrated circuit chip where several circuits and arrays are positioned. A RAM (random access memory) array 101 is shown at the left edge of the layout juxtaposed to two "dummy" CAM (content address memory) cell lines 103. The RAM array 101 is coupled to a write driver 102 and a sense amplifier 104. Next to the CAM cell lines 103 is shown an ECAM (effective address content addressable memory) cell 105. The ECAM receives a 12-bit "effective address" from, for example, the system CPU. A word line driver circuit 107 is positioned adjacent to the ECAM cell 105 and an RCAM (real address content addressable memory) cell 109 is next to the word line driver circuit 107. The RCAM receives a 32-bit "real address" from a segmented "look-ahead" or a table "look-ahead" buffer in the present example. Another set of dummy CAM cell lines 111 is positioned between the RCAM cell 109 and another RAM array 113. The RAM array 113 is also coupled to a write drive circuit 114 and a sense amplifier 116. A "word line" 115 (WL) is illustrated as are "dummy" cam cells 117 and 119. The dummy ECAM cell 117 is coupled to the ECAM 105 for effective address matching and the dummy RCAM cell 119 is coupled to the RCAM 109 for use in real address matching. The ECAM cell includes an ECAM match line 121 and the RCAM includes an RCAM match line 123. Details of the illustrated circuits and arrays are shown in greater detail in the descriptions that follow.

FIG. 2 through FIG. 9 show various portions of an exemplary arrangement of the word line driver circuit 107.

Figure 2:
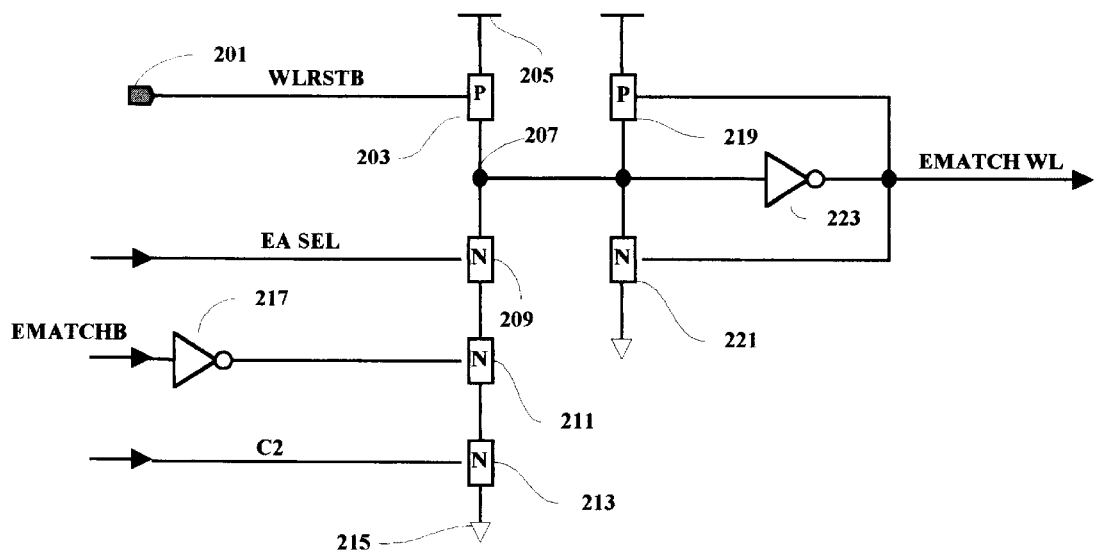
FIG. 2 is a schematic diagram showing one portion of the word line driver circuit of FIG. 1.

In FIG. 2, a terminal 201 is arranged to apply a WLRSTB (word line reset bar) signal to a gate terminal of a PFET 203. The transistor 203 is connected between a source or logic "1" potential 205 and a common node 207. Three NFET devices 209, 211 and 213 are connected in series between the common node 207 and ground or a logic "0" level potential, respectively. An inverter 217 is arranged to receive an EMATCHB (effective address match "bar") signal and apply the inverted signal EMATCH (effective address match bar) signal to the gate terminal of NFET 211. NFET 209 is arranged to receive an EA SEL signal (from FIG. 13) at its gate terminal and the gate terminal of NFET 213 is arranged to receive the clock signal C2. PFET device 219 and NFET device 221 are connected in series between the source and ground. The common point between transistors 219 and 221 is connected to the common node 207 and is also connected to the input of an inverter 223. The output of inverter 223 provides an output signal EMATCH WL (effective address match word line) which is also applied to the gate terminals of "keeper" transistors 219 and 221.

Figure 3:
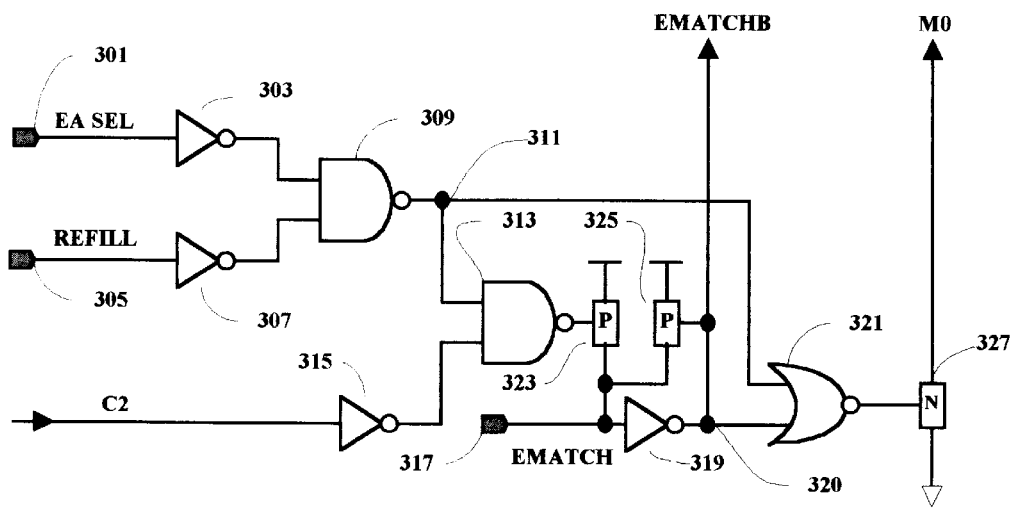
FIG. 3 is a schematic diagram of another portion of the word line driver circuit.

In FIG. 3, terminal 301 is arranged to apply an EA SEL signal to the input of an inverter 303 the output of which is connected to one input of a NAND gate 309 in the present example. Another terminal 305 is arranged to apply a REFILL signal to the input of an inverter 307 the output of which is connected to the other input of the NAND gate 309. The output of the NAND gate 309 is connected to a common node 311 which is, in turn, connected to one input of another NAND gate 313. A second input to the NAND gate 313 is connected to the output of an inverter 315, the input of which is arranged to receive the C2 clock signal. An NFET device 327 is connected between an M0 node and the logic 0 potential or ground, and the gate terminal of the transistor 327 is connected to the output of a NOR gate 321. One input of the NOR gate 321 is connected to the output of the NAND gate 309 and the other input of the NOR gate 321 is connected to the output of an inverter 319. The input to the inverter 319 is arranged to receive the signal EMATCH from terminal 317. Two PFET devices 323 and 325 are connected in parallel between the source potential and the input to the inverter 319. The gate terminal of the PFET 323 is connected to the output of NAND gate 313 and the gate terminal of the PFET 325 is connected to the output of the inverter 319. The output of the inverter 319 is arranged to provide the EMATCHB output signal. If the signal REFILL is low, it is indicative that the system is in a "read" mode and if the signal REFILL is "high" (at a high logic level), then the system is in a "write" mode. Also, if signal EA SEL is low and REFILL and C2 are both low, then the EMATCH line WL is precharged to VDD, i.e. the logic "1" potential in the present example. When C2 goes high, then the PFET 323 is "off".

Figure 4:
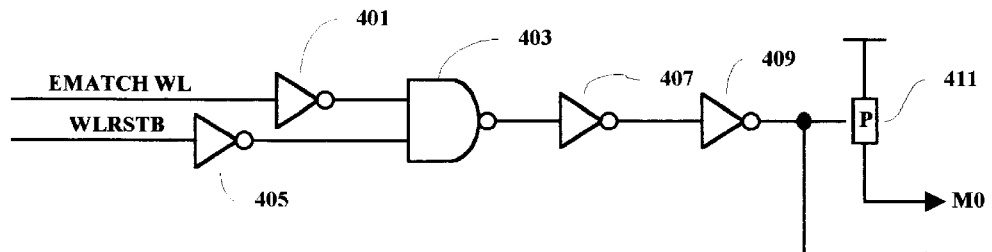
FIG. 4 is a schematic diagram of another portion of the word line driver circuit.

In FIG. 4, the EMATCH WL signal is applied to the input of an inverter 401, the output of which is connected to one input of a NAND gate 403. The other input to the NAND gate 403 is connected to the output of inverter 405 which receives the WLRSTB signal at its input. The output of the NAND gate 403 is connected to the input of an inverter 407. The output of inverter 407 is connected to the input of another inverter 409 which has its output terminal connected to the gate terminal of a PFET device 411. PFET device is connected between the source or logic "1" potential and the M0 node. The output of the inverter 409 also provides an output RS4 signal.

Figure 5:
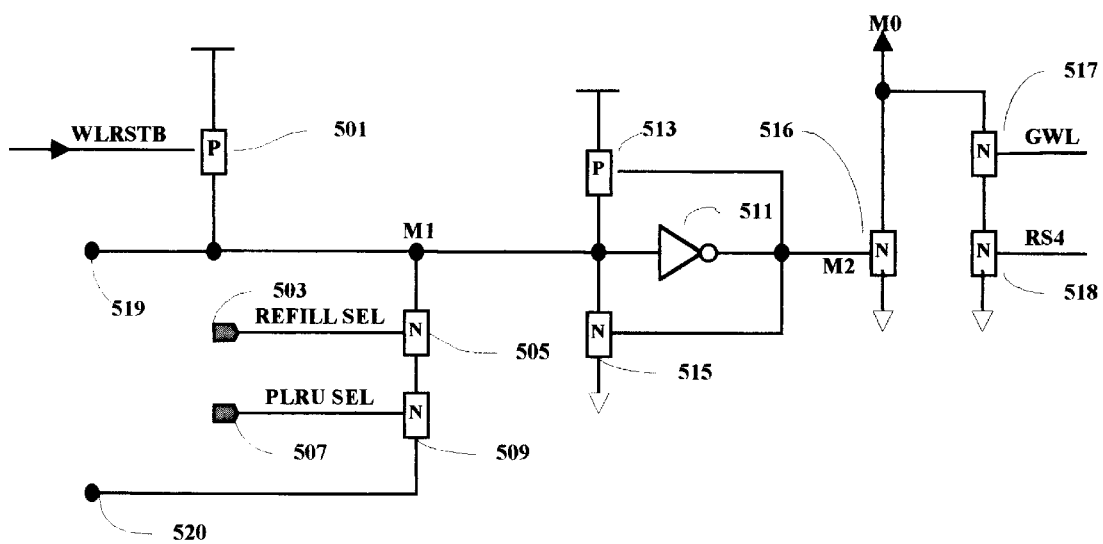
FIG. 5 is a schematic diagram of another portion of the word line driver circuit.

As shown in FIG. 5, The WLRSTB signal is applied to the gate terminal of a PFET device 501. PFET device 501 is connected between the source potential and node M1 519. A pair of series connected NFET devices 505 and 509 are connected between the M1 node and node 520. Input terminal 503 is arranged to apply signal REFILL SEL to the gate terminal of the NFET 505 and terminal 507 is arranged to apply signal PLRU SEL (least recently used line select) to the gate terminal of the NFET 509. Whenever there is a cache miss, the data is brought from the L2 cache or main memory. The least recently used cache line is selected (PLRU SEL) and the refill signal (REFILL) goes high to select the wordline WL. Then the data is written into that particular cache line. The M1 node is connected to the input of an inverter 511 which has its output connected to node M2 which is connected to the gate terminal of an NFET device 516. A PFET device 513 and an NFET device 515 are serially connected between the source and ground potentials. The common point between the transistors 513 and 515 is connected to the M1 node, and the gate terminals of the transistors 513 and 515 are connected to an M2 node which is the output of the inverter 511. Transistor 516 is connected between the M0 node and ground. The M0 node is also connected through two series connected NFET devices 517 and 518 to ground. The gate terminal of transistor 517 is arranged to receive the GWL (global word line) signal and the gate terminal of the transistor 518 is arranged to receive the RS4 signal.

Figure 6:
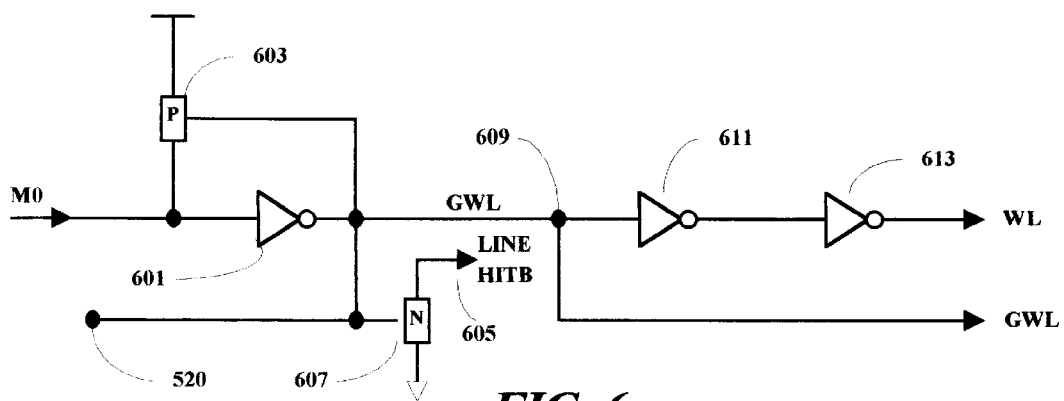
FIG. 6 is a schematic diagram of another portion of the word line driver circuit.

FIG. 6 shows the M0 node connected to the input of an inverter 601, the output of which is connected to a common node 609. Node 609 is, in turn, connected through two series connected inverters 611 and 613 to provide the WL (word line) signal. A PFET device 603 is connected between the source potential and the input terminal of inverter 601. The GWL node 609 also provides a direct connection as an output from the FIG. 6 circuitry. The output of the inverter 601 is connected to the gate terminal of the transistor 603 and is also connected to the terminal 520 (shown also in FIG. 5). Terminal 520 is connected to the gate terminal of an NFET device 607. Transistor 607 is connected between an output LINE HITB node 605 and ground.

Figure 7:
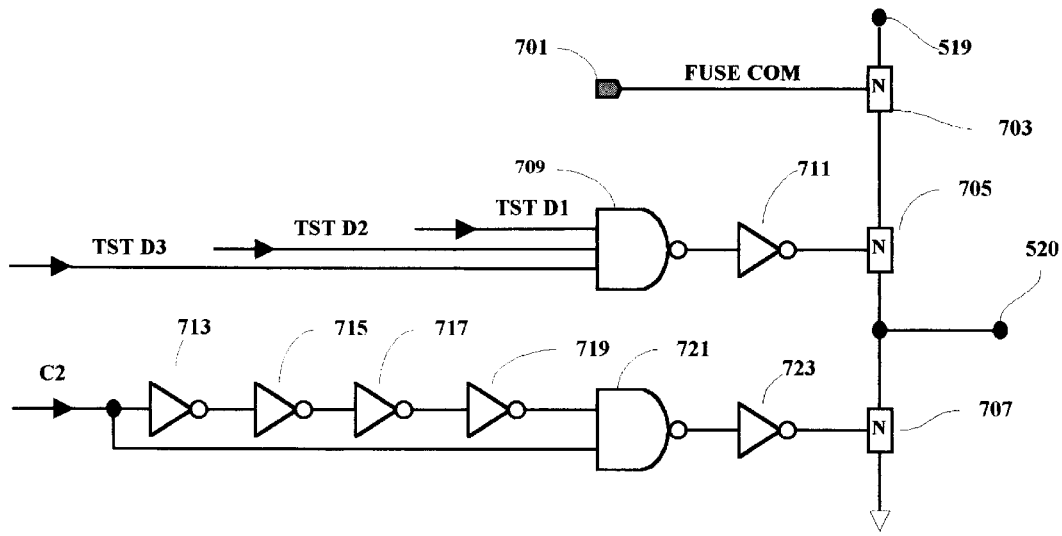
FIG. 7 is a schematic diagram of another portion of the word line driver circuit.

As shown in FIG. 7, a FUSE COM signal is applied to the gate terminal of an NFET device 703 from terminal 701. The FUSE COM signal is used to for purpose of checking redundancy. If one word line or one row is not functioning properly, then FUSE COM will go low and the word line or row will not be selected. Transistor 703 is connected in series with two other NFET devices 705 and 707 between terminal 519 and ground, respectively. The common point between transistors 705 and 707 is provided as an output at terminal 520. A NAND gate 709 receives three input signals TST D1, TST D2 and TST D3, and has its output connected through an inverter 711 to the gate terminal of the NFET device 705. The test signals test addresses within the cache system and the signals are, for example, generated from a built-in self test (BIST) routine. The clock signal C2 is applied through four series connected inverters 713, 715, 717 and 719 to one input of a NAND gate 721. The other input to the NAND gate 721 is arranged to receive C2 directly. The output of the NAND gate 721 is connected through an inverter 723 to the gate terminal of the NFET device 707.

Figure 9:
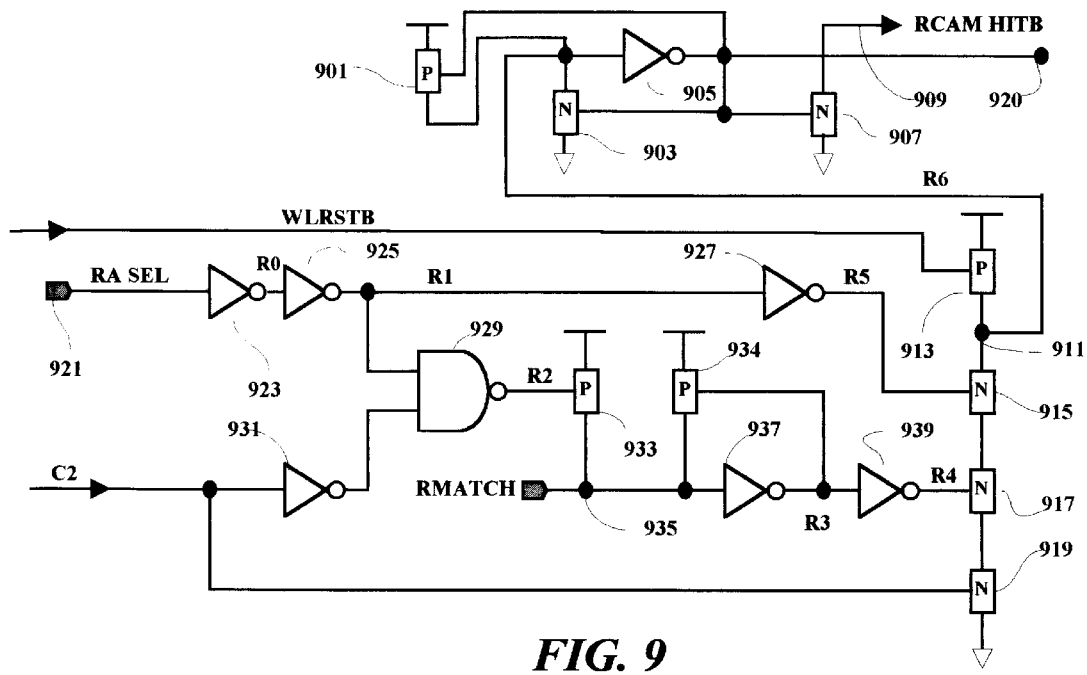
FIG. 9 is a schematic diagram of another portion of the word line driver circuit.
Figure 8:
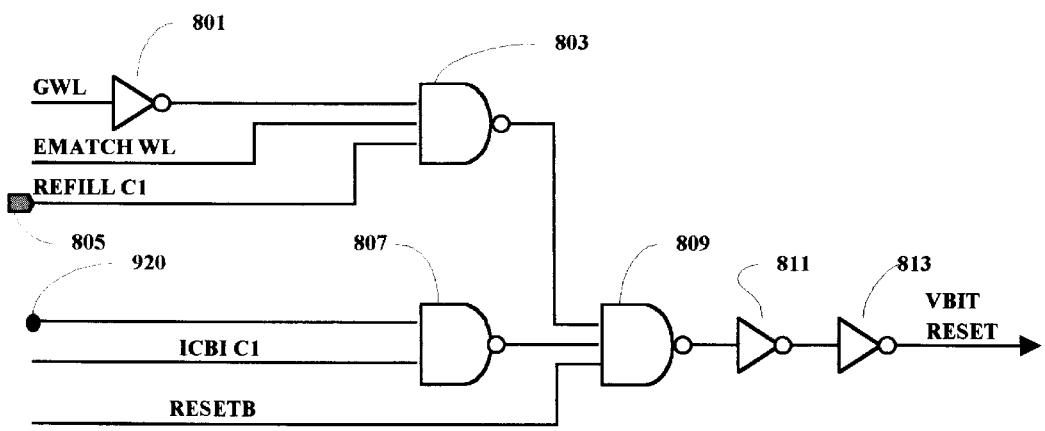
FIG. 8 is a schematic diagram of another portion of the word line driver circuit.

In FIG. 8, the GWL signal is applied to the input of an inverter 801 the output of which is connected to one input of a three input NAND gate 803. Another input to the NAND gate 803 is arranged to receive the EMATCH WL signal and a third input REFILL C1 is applied from the terminal 805. The output from the NAND gate 801 is connected to one input of another NAND gate 809. A second input to the NAND gate 809 is connected to the output of NAND gate 807. NAND gate 807 has one input connected to a terminal 920 and a second input arranged to receive signal ICBI C1. A third input terminal of the NAND gate 809 is arranged to receive signal RESET B. The output of the NAND gate 809 is connected through two series connected inverters 811 and 813 to provide a VBIT RESET (valid bit reset). In the cache or CAM circuitry, there is a VBIT (valid bit) indicator bit for each line in the memory. If the VBIT equals "0" for any line, then that particular line is invalid. In the ICBI cycle, the real address is compared against the contents of the RCAM. The ICBI signal is high and if all of the bits of RCAM are identical, and clock C2 is high, and RA SEL is low, then the R5 node is pulled low and the RMATCH line will be high (FIG. 9). The output of NAND gate 807 (node ICBI RESET) will be forced low and VBIT RESET will go high. When VBIT RESET is forced high, the valid bit VBIT will be set to zero which means that the cache line or word line becomes invalid and is not used. If there is a miss in RCAM, then VBIT is not reset to zero. In that case, signal RESETB is pulled low and VBIT RESET will be high (FIG. 8). That, in turn, sets all of the valid bit VBIT to zero.

In FIG. 9, a PFET device 901 is connected in series with an NFET device 903 between the source and ground potentials. The common point between the transistors 901 and 903 is connected to the input of an inverter 905. The output of inverter 905 is connected to the gate terminal of the PFET 901 and also to an output terminal 920, and the gate terminals of NFET devices 903 and 907. NFET 907 is connected between an output terminal 909 and ground. Output terminal 909 provides output signal RCOM HITB. A PFET device 913 is connected between the source and a common point 911. The gate terminal of the PFET 913 is arranged to receive the WLRSTB signal. Three series connected NFET devices 915, 917 and 919 are connected between the common point 911 and ground. The common point 911 is also connected to the input terminal of the inverter 905. Signal RA SEL is applied to the input terminal of an inverter 923 through terminal 921. The output of the inverter 923 (R0 node) is connected through two series connected inverters 925 and 927 to the gate terminal (node R5) of the NFET 915. The output of the inverter 925 (node R1) is also connected to one input of a two input NAND gate 929. The other input to the NAND gate 929 is connected to the output of an inverter 931 which is arranged to receive an input C2 signal. The C2 input is also applied to the gate terminal of NFET device 919. Two PFET devices 933 and 934 are connected in parallel between the source potential and an RMATCH node 935. The output of the NAND gate 929 (node R2) is connected to the gate terminal of the PFET device 933. Node 935 is connected to the input of inverter 937, the output of which (node R3) is connected through another inverter 939 to the gate terminal of NFET device 917 (node R4). The output of inverter 937 is also connected to the gate terminal of the PFET device 934.

Figure 10:
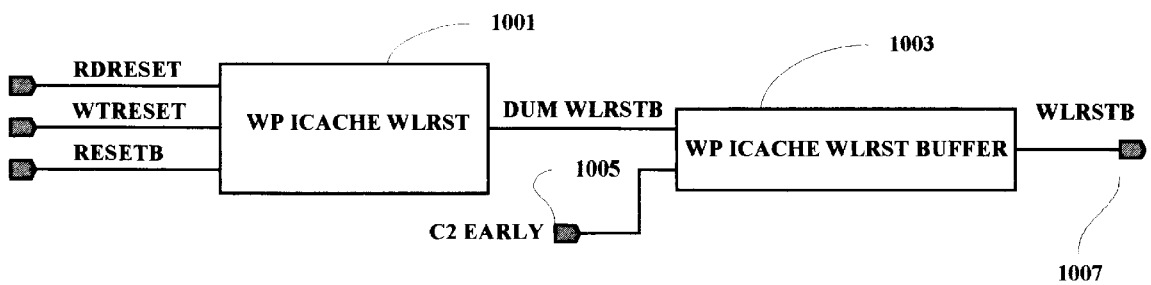
FIG. 10 is an illustration of an exemplary generator circuit for the WLRSTB signal.

In FIG. 10, a WP ICACHE WLRST (word line reset) circuit 1001 is arranged to receive three input signals, viz. RDRESET (read reset), WTRESET (write reset) and RESETB (reset "bar" or reset inversion). The WP ICACHE WLRST circuit 1001 outputs a DUM WLRSTB signal which is applied to a WP ICACHE WLRST BUF buffer circuit 1003 along with another input C2 EARLY applied from terminal 1005. The buffer circuit 1003 provides an output WLRSTB signal at terminal 1007.

Figure 11:
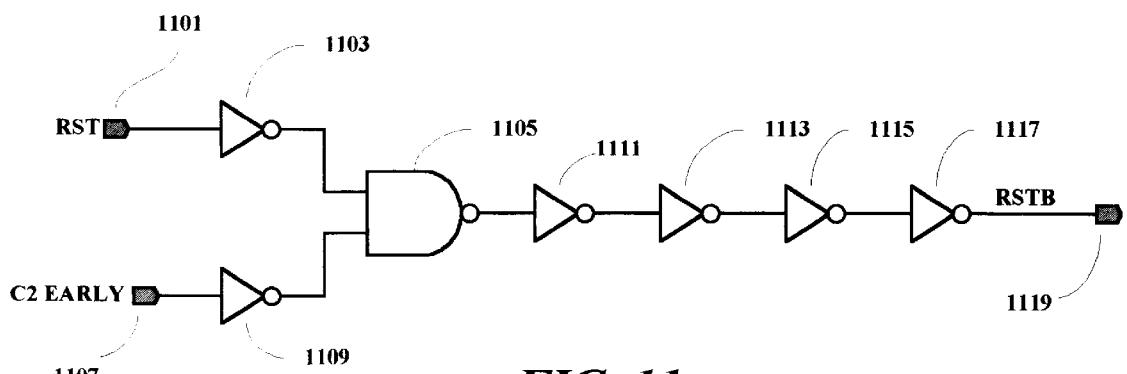
FIG. 11 is a drawing showing the logic for generating the RSTB signal.

FIG. 11 shows a RST signal applied at terminal 1101 to the input of an inverter 1103 and a C2 EARLY signal which is applied at terminal 1107 to the input of another inverter 1109. The outputs from the inverters 1103 and 1109 are applied to the inputs of a two input NAND gate 1105. The output of the NAND gate 1105 is connected through four series connected inverters 1111, 1113, 1115 and 1117 to provide a WLRSTB output signal at terminal 1119. If WLRSTB is low, the word line WL is precharged and if WLRSTB is high then the word line WL is in the evaluation phase.

Figure 12:
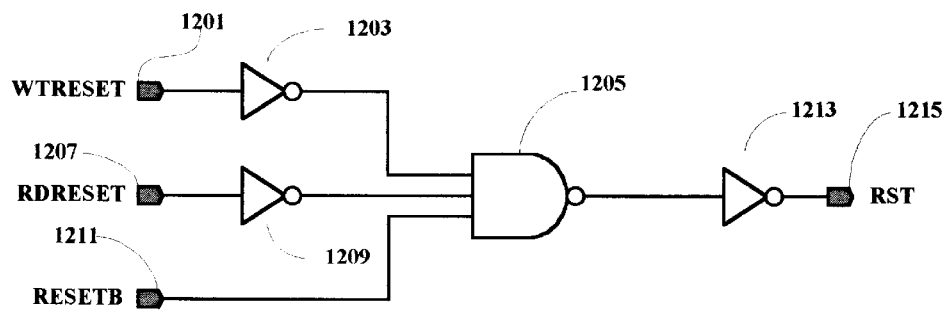
FIG. 12 is a drawing showing the logic circuitry implemented in generating RSTB.

In FIG. 12, the signal WTRESET indicates that a write operation is complete and is applied at terminal 1201 to the input of an inverter 1203. Signal RDRESET, indicating that a read operation is complete, is applied at terminal 1207 to the input of another inverter 1209. The outputs from the inverters 1203 and 1209 are connected to two inputs of a three input NAND gate 1205. The third input to the NAND gate 1205 is connected to a terminal 1211 to which is applied the signal RESETB. The RESETB is identical to RESETB in FIG. 8. If RESETB is low, all of the cache lines are invalidated, i.e. VBIT is set to "0". If RESETB is high, then normal cache operation occurs. The output from the NAND gate 1205 is connected through an inverter 1213 to provide an output signal RST at terminal 1215 which is input to inverter 1103 in FIG. 11.

Initially, WTRESET and RDRESET are low, which will force WLRSTB to be high, and the word line WL is in the evaluation mode. When the last bit is read from the array, then the RDRESET signal is forced high which applies a low input to the NAND gate 1205 and the RST signal goes low. Similarly, when the last bit is written to the array, then the WTRESET signal is forced high which applies a low input to the NAND gate 1205 and the RST signal goes low. If C2 EARLY is also low, then WLRSTB is forced low and the word line driver goes to the precharge state i.e. WL is forced low.

Figure 13:
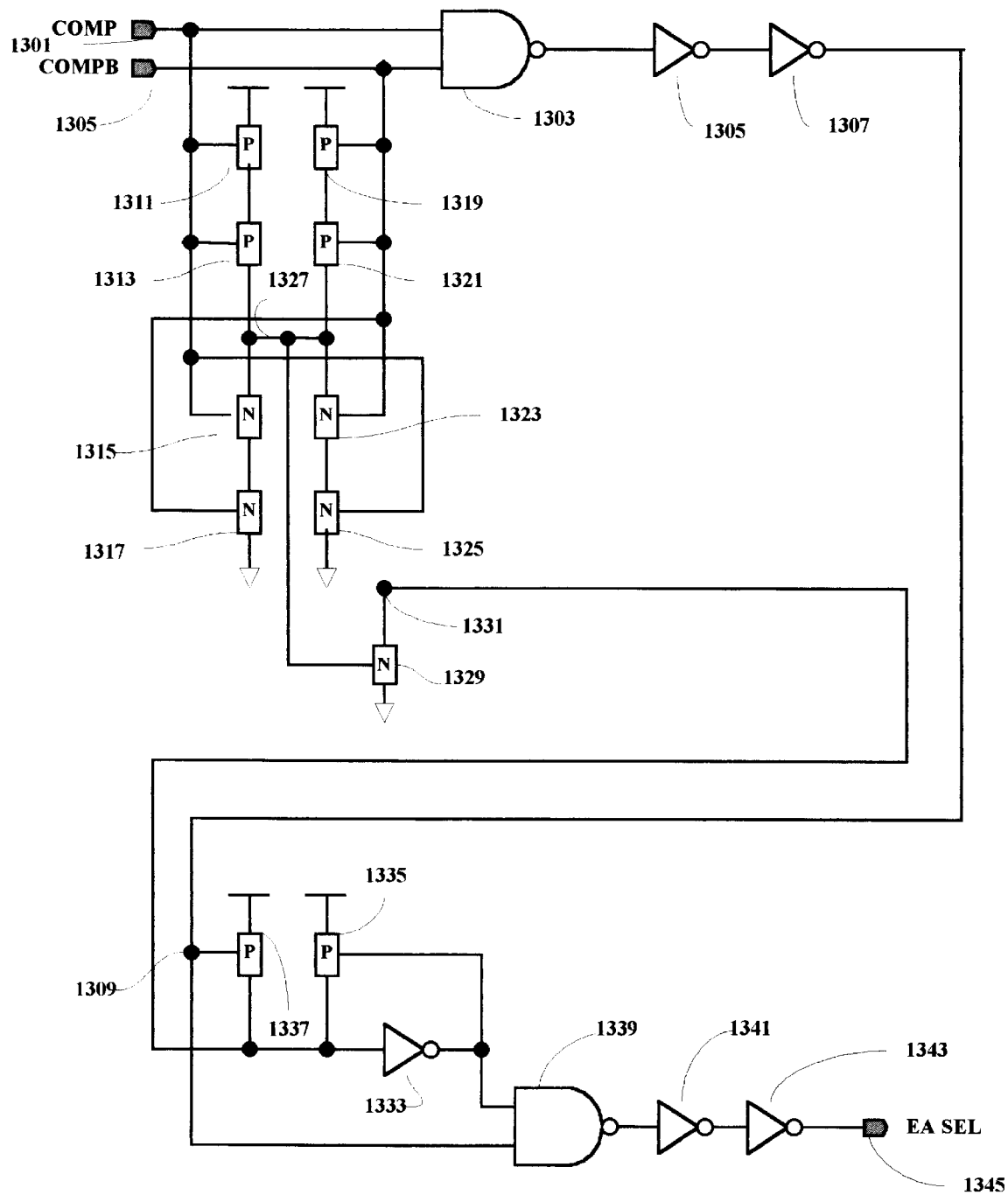
FIG. 13 is a schematic diagram showing an exemplary dummy ECAM cell circuit.

In FIG. 13, signals COMP and COMPB are the compare signals which are generated from the dummy ECAM 117 in comparing the effective address or tag address bit(s) farthest away from the word line driver 107 with the content of the ECAM 105. The COMP and COMPB signals are applied at terminals 1301 and 1305, respectively, of the dummy ECAM cell circuit 117 which is shown in detail in FIG. 13. Terminals 1301 and 1305 are connected to the input terminals of a two input NAND gate 1303. The output of the NAND gate 1303 is connected through two series connected inverters 1305 and 1307 to a common node 1309. Two series connected PFETS 1311 and 1313 are connected between the source potential and a common point 1327 and two series connected NFET devices 1315 and 1317 are connected between the common point 1327 and ground. Similarly, two series connected PFET devices 1319 and 1321 are connected between the source or logic 1 potential and the common point 1327 and two NFET devices 1323 and 1325 are serially connected between the common point 1327 and ground. The gate terminals of transistors 1319, 1321, 1323 and 1317 are connected to receive the COMPB signal and the gate terminals of the transistors 1311, 1313, 1315 and 1325 are arranged to receive the signal COMP. The common point 1327 is also connected to the gate terminal of an NFET device 1329 which is connected between a common point 1331 and ground. The common point is connected to the input of an inverter 1333. The output of inverter 1333 is connected to one input of a two input NAND gate 1339. The other input to the NAND gate 1339 is connected to the node 1309. Two PFET devices 1337 and 1335 are connected in parallel between the source potential and the input to the inverter 1333. The gate terminal of the transistor 1337 is connected to node 1339 and the gate terminal of the transistor 1335 is connected to the output of inverter 1333. The output of the NAND gate 1339 is connected through series connected inverters 1341 and 1343 to provide an output signal EA SEL at terminal 1345. When the CPU-requested or "tag" addresses are being compared against the content of ECAM, either COMP is high and COMPB is low or vice versa, i.e. the COMP and COMPB signals are opposite logical states. In that case the system is in an evaluation mode and EA SEL (effective address select) is low. When COMP and COMPB are both high, the system is in a precharge mode and EA SEL output to inverter 303 (FIG. 3) is high.

Figure 14:
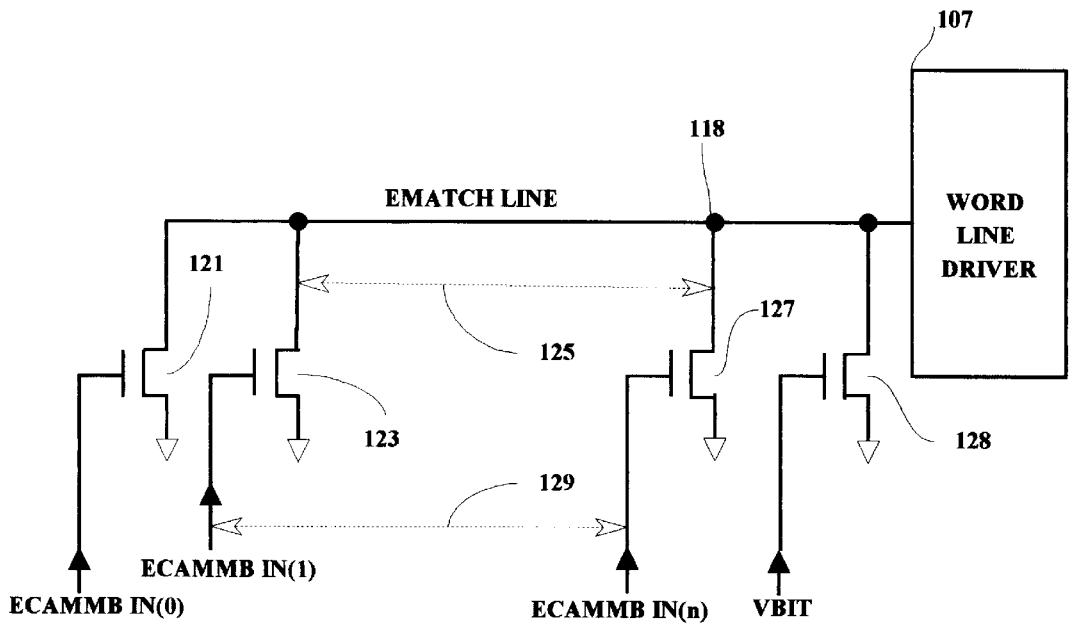
FIG. 14 is a schematic diagram showing an exemplary embodiment of an input circuit connection to the EMATCH line of the wordline driver circuit disclosed herein.

In FIG. 14, there is shown the EMATCH line 118 connected to the word line driver circuit 107 as earlier discussed in connection with FIG. 1. FIG. 14 also shows an input circuit comprising a series of NFET devices including NFET 121 for receiving input ECAMMB IN(0), (i.e. a first of a series 129 of effective content addressable memory match "bar" signals) NFET 123 for receiving ECAMMB IN(1) and so on continuing 125 to NFET 127. NFET 127 is arranged to receive input ECAMMB IN(n), where "(n)" designates a whole integer number related to the width of the address bus in a system. Also shown is another NFET device 128 connected between the EMATCH LINE 118 and ground and arranged to receive a VBIT input signal which, when in the high state, is indicative of a valid input bit status. When a system processor, for example, requests an address from memory, a check is made to determine if the address is in the cache memory. The bits of the requested address are matched against the corresponding bits of the cache addresses and if there is a match between the effective address requested and the content of ECAM (effective content addressable memory) on the (0) bit line, then ECAMMB IN(0) will be low. Otherwise, there is no match, and the line ECAMMB IN(0) will be high, meaning "no match". When there is no match, the EMATCH line should go low since it will be false that a match condition exists. However, in the past (without the "dummy" ECAM or RCAM cells and the wordline driver circuit 107 as herein disclosed), if only one bit or one input is mismatched even though the rest of the bits are matched, there will be a no match condition but there will only be one NFET or NMOS transistor to pull the EMATCH LINE low. With intrinsic capacitance and other factors, when only one or only a few of the NFET devices 121–127 is operating to pull the EMATCH LINE low, there will be a relatively long time delay. If, in addition, the "no match" bit is located farthest away from the wordline driver circuit 107, the delay will be even greater and significant timing problems may occur, e.g. the EMATCH LINE may not discharge in a given amount of time and the EMATCH LINE will return a high state indicating that there is a match in the cache when in fact there is no match. In the present design, the "dummy" CAM cell (shown in FIG. 13) is placed at the end of the EMATCH LINE farthest away from the wordline driver. The output EA SEL form the dummy cell is a required input before the EMATCH LINE is sampled. That arrangement substantially eliminates many of the timing problems inherent in prior art devices.

In operation, the L1 cache system receives a 12-bit "effective address" for an instruction from a system CPU, and a 32-bit "real address" from, for example, a "look-ahead" buffer. The effective address represents the end 12-bits of the real address. The cache system also receives several control signals from the system CPU including a "refill" signal, test signals from a built-in self-test routine, and a FUSE COM redundancy signal. The cache system also implements three clock signals C1, C2 and C2 EARLY from a system clock. In addition to memory outputs, the L1 cache system provides output signals ECAM HITB and RCAM HITB which indicate "hits" in the effective address content addressable memory (ECAM) or the real address content addressable memory (RCAM), respectively.

Signal WLRSTB (word line reset bar) precharges the wordline driver portion of the L1 cache circuit. The wordline driver circuit is illustrated in FIG. 2 through FIG. 9. The generator circuit for WLRSTB is shown in FIG. 10. As shown in FIG. 10 and FIG. 11, the signal WLRSTB is generated by C2 EARLY CLK and DUM WLRSTB. If both RST and C2 EARLY are "low" (at a low logic level), then WLRSTB will be low and the wordline driver is in a precharge mode. Otherwise, WLRSTB will be high which means that the word line driver circuit is in an evaluation mode. DUM WLRSTB (the "dummy" wordline reset "bar" signal) is generated by combining WTRESET (write reset), RDRESET (read reset) and RESETB (reset "bar" or the inversion of RESET), as shown in FIG. 12. Whenever the cache (FIG. 1) is reset, i.e. if all of the lines in the cache are forced invalid, then RESETB is forced low. That action will pull WLRSTB to a low condition and consequently all of the wordline driver circuit will go to a precharge mode (the cache wordline or WL is forced low). Also, when the VBIT node in the cache is set to zero, the cache line is invalid.

If the cache is not being reset, then the cache is being accessed. Whenever the cache is accessed, the cache is either in a read mode or a write mode operation. In a read mode operation, the signal RDRESET will make a pulse high and WLRSTB will follow to pulse low at a time when C1 CLK goes "high" (to a high logic level). Similarly, in a write operation, signal WTRSTB (write reset bar) will pulse high and WLRSTB will follow to pulse low at a time when C1 CLK goes high. When RDRESET and WTRESET go low, WLRSTB will also go low following a predetermined time delay.

In the exemplary cache circuit, when C2 CLK goes high, and C1 CLK is low, then the cache is in the evaluation mode. In that case, WLRSTB will be high and the wordline WL (which will be high) will be selected if C2 CLK is high, C1 CLK is low, and if there is an effective cache hit (ECAM is high) or the cache is in the refill cycle or the test mode cycle as hereinafter described. When C2 CLK (which is the inversion of C1 CLK) goes low and C1 CLK is high, then the cache will be propagating the data out of the cache array or writing the data into the cache array. In that case, either RDRESET or WTRESET will go high. C2 EARLY CLK has the same phase as C2 CLK but toggles slightly before C2 CLK.

In the wordline driver circuit shown in FIG. 2 through FIG. 9, whenever signal WLRSTB goes low, there will be a reset condition and nodes M1 and M0 will go high. Also node E5 is forced high and EMATCH WL goes low. This will pull VBIT RESET low, and after a certain delay, node M0 will be precharged to high and the word line will go low. VBIT RESET is pulled low before the word line (WL) is pulled low in order to prevent any erroneous pulse on the VBIT RESET line. Once signal WLRSTB goes high, the wordline WL 115 is ready for evaluation.

In the exemplary cache circuit illustrated, there are two sets of CAM (content addressable memory) cells. One set is for effective content address memory (ECAM) and the second set is for "real" content address memory (RCAM). The wordline driver circuit 107 is located in the middle of the array. Two sets of "dummy" CAM cell lines 103 and 111 are added in both CAM cell sets and they are positioned farthest away from the word line driver as shown in FIG. 1. The dummy CAM cells are for timing purposes. The dummy ECAM cell circuit is shown in FIG. 13 and is physically located in the bottom center of FIG. 1. Whenever an ECAM or an RCAM fetch cycle is performed, COMP will stay high and COMPB will be pulled low. That action will force node N6 and node N1 to go high and EA SEL will also go high. Both COMP and COMPB stay high in precharge mode and also during the REFILL cycle or the write mode. This forces EA SEL to stay high which will keep the EMATCH line high.

Figure 15:
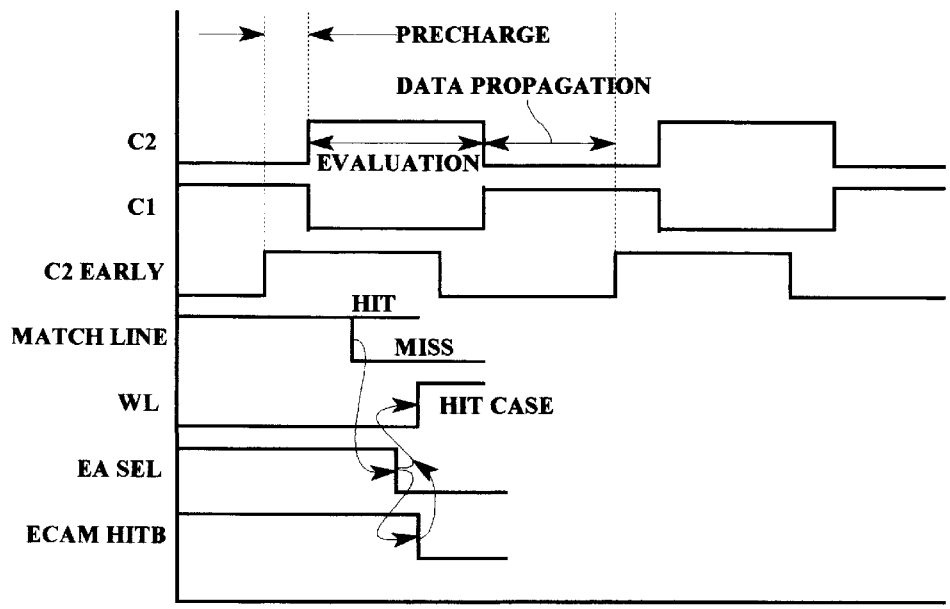
FIG. 15 is a signal timing chart helpful in explaining the operation of several of the signals of the exemplary cache system.

In FIG. 15, the relative timing relationships are illustrated for several of the signals within the wordline driver circuit 107. As shown, clock signals C1 and C2 are provided for basic circuit timing and another clock timing signal C2 EARLY is also provided in the exemplary embodiment. Signal C2 EARLY is generated to go high several hundred pico-seconds ahead of the transition time when C2 goes high and C1 goes low. The time between the time that C2 EARLY goes high and the time when C2 goes high is the time during which the precharge cycle takes place. While C2 is high, the wordline driver circuit 107 is in an "evaluation" phase during which signal evaluations may occur. A "data propagation phase occurs when C2 is low until C2 EARLY goes high. During data propagation, data is read and then sent out of the cache, or data is written into the cache array. When there is a "hit" in the ECAM for example (i.e. a requested effective address is found to be resident in the "effective address content addressable memory), the ECAM match line EMATCH will remain high (assuming an existing high state), and a "miss" will cause the match line to go low. Whenever EMATCH is high and EA SEL goes low, then the ECAM HITB signal goes low and the word line signal WL will go high.

Figure 16:
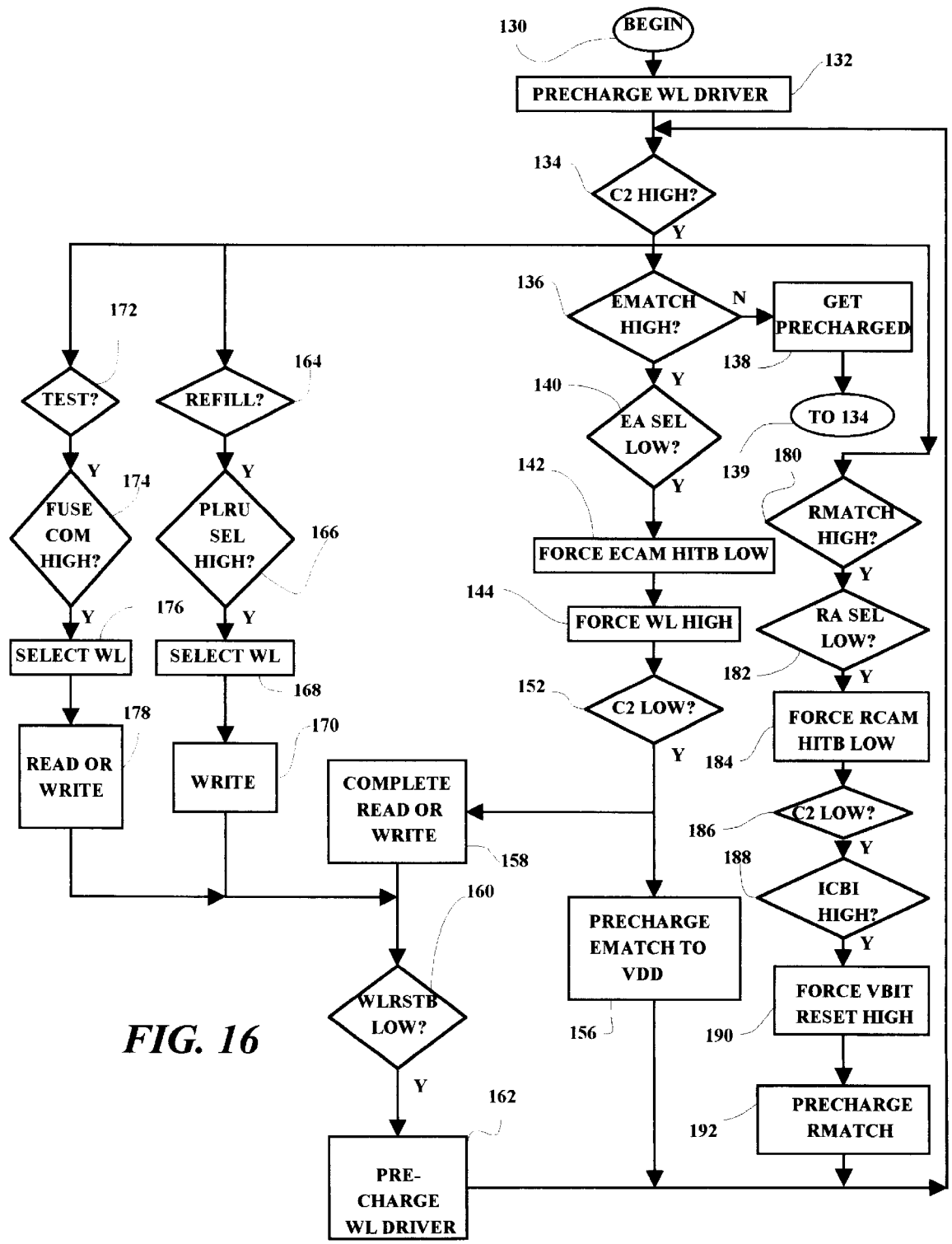
FIG. 16 is a flow chart illustrating an operational sequence of the functions accomplished by the disclosed exemplary embodiment of the present invention.

As shown in the FIG. 16 flow chart, an exemplary operation begins 130 and the wordline driver circuit 107 is precharged 132 to an initial state. When signal C2 goes high 134, the driver will determine 136 if there is a match between the effective address input to the driver and the effective addresses resident in the ECAM. If there is no match, the circuit gets precharged 138 and returns 139 to block 134 to await the next C2 transition to a high state. If there is an ECAM match 136 (EMATCH) and EA SEL is low 140, then ECAM HITB goes low 142 which forces the word line WL high 144. When C2 next goes low 152, EMATCH is precharged to VDD 156 and the read or write operation associated with the effective address requested is completed 158. Next, when the word line reset "bar" signal WLRSTB goes low 160, the word line driver is precharged 162 and the system returns to block 134 to await the next C2 high pulse. The above describes a normal fetch operation as performed in the exemplary word line driver circuit.

If the wordline driver 107 is in a "prefetch" mode, the driver is performing a similar operation except that RCAM 109 is used instead of the ECAM 105 and the address to be matched is a 32-bit real address inputted from a "look-ahead" buffer or table. In the prefetch mode, after C2 goes high 134, a determination is made as to whether there is a match between a requested "real" address and the content of the real address content addressable memory RCAM. If so, RMATCH will go high 180. If a real address select signal RA SEL is also high 182, the RCAM HITB signal will be forced low 184. Thereafter, when C2 goes low 186 and the Instruction Cache Block Invalidation (ICBI) signal is high 188, then VBIT RESET goes high 190, RMATCH is precharged 192 and the system returns to block 134 to await the next C2 high-going pulse. The RCAM HITB signal for the real addresses input (32 bits) to the driver is generated in a manner similar to the generation of the ECAM HITB signal for the effective address input (12 bits) except that the RCAM HITB signal is part of a prefetch operation and indicates whether there is a match in the RCAM for a real address input, and the ECAM HITB signal is part of the normal fetch operation for effective addresses received from the CPU. In the prefetch cycle, when there is a hit or a match between a real address and the contents of the RCAM, RCAM HITB is low, but the data is not read from the cache (WL is not selected). This is in contrast to the normal fetch cycle where the data residing at the effective address is read out 158.

Whenever C2 is detected as going high 134, the wordline driver 107, in addition to going into a fetch operation or a prefetch operation, may also implement a test function or a refill or write function. In the test function or test mode, the cache is written to and read from by a built-in self test signal (ABIST). If the word line driver is determined to be in the test mode 172, and the FUSE COM signal is high 174, then the wordline is selected 176 and a read or write test operation is performed 178. Thereafter, if WLRSTB is low 160 the wordline driver is precharged 162 and the system returns to block 134 to await the next C2 high-going transition. If the ECAM or RCAM is tested to be good, then signal FUSE COM (FIG. 7) will be high. If FUSE COM is low, a particular row has tested bad and it will never be selected. That row will be replaced by an extra built-in redundant row. When all of the addresses (TST D1, TST D2 and TST D3 in the example) and also the clock C2 are high (FIG. 7), and also if FUSE COM is high, then the M1 node 519 (FIG. 5) is pulled low. The M2 node will go high, and the M0 node (FIG. 5) is pulled low. The global word line WL is selected. Once the word line goes high, the "test read" or the "test write" which is being run, will be accomplished.

In the refill cycle 164, if REFILL is high, the data is written into the array. The least recently used circuit (PLRU signal) selects the line. Once the line is selected, signal PLRU is forced high (FIG. 6). If the C2 clock is high, and since the cache is in refill mode, signal REFILL is forced high. In that situation, Node M1 is pulled low and M2 is pulled high. Node M0 is pulled low (FIG. 5) and that action will select the global word line WL 176 (FIG. 16) and the data is written 170 into the RAM array. If PLRU or REFILL is low, then the word line is not selected (WL stays low). Thereafter, WLRSTB goes low 160, the wordline WL is precharged 162 and the system is returned to block 134 to await the next high-going transition of C2.

If REFILL (see FIG. 3) is low (read mode), and EA SEL goes low, then node 311 will go low. That action will force the precharge transistor 323 to be off and the circuit will respond in accordance with the state of the EMATCH line. In an exemplary effective address hit/miss cache operation, the EMATCH line, nodes M0 and M1 and the RMATCH line are precharged to the high logic level. The cycle begins with the C2 clock signal going high. If the effective addresses are identical to the content of the ECAM cells, then the EMATCH line will stay high. When EA SEL goes high (FIG. 3) then the output of gate 321 is forced high. That action will pull node M0 low and node GWL (FIG. 6) will be forced high. The global word line GWL will go high and also LINE HITB (FIG. 6) will be pulled low. If LINE HITB ("Line Hit" Bar) is pulled low, there is a line "hit" in the cache. If the effective addresses are not identical to the contents of the CAM cell, then the EMATCH line is pulled low and the output of gate 321 is forced low. Node M0 will stay in the precharge mode which is high, and the global wordline WL will stay low also. Signal LINE HITB will stay in precharge mode (high).

The method and apparatus of the present invention has been described in connection with an exemplary embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for operating a cache memory, said method comprising:
    providing a clock signal, said clock signal being effective for defining sequential clock timing cycles;
    determining a selected one of a plurality of selectively operable cache functions to be completed during a single clock cycle; and
    completing said selected cache function during said single clock cycle, said selectively operable cache functions including:
        determining whether a first match exists between an input effective address and one of a plurality of addresses resident in an effective address portion of said cache memory;
        providing a first output signal representative of said first match;
        determining whether a second match exists between an input real address and one of a plurality of addresses resident in a real address portion of said cache memory; and
        providing a second output signal representative of said second match.

2. The method as set forth in claim 1 wherein said effective address comprises a first number of bits and said real address comprises a second number of bits, said first number of bits being different from said second number of bits.

3. The method as set forth in claim 2 wherein said first number of bits is smaller than said second number of bits.

4. The method as set forth in claim 3 wherein said effective address comprises a segment of said real address.

5. The method as set forth in claim 1 wherein said real address is associated with a prefetch cache function.

6. The method as set forth in claim 5 wherein said real address is input from a look-ahead storage device, said effective address being related to an address of a current call to said cache memory, said real address being related to an address of a subsequent call to said cache memory.

7. The method as set forth in claim 5 wherein said effective address comprises a first number of bits and said real address comprises a second number of bits, said first number of bits being different from said second number of bits.

8. The method as set forth in claim 7 wherein said first number of bits is smaller than said second number of bits.

9. The method as set forth in claim 8 wherein said effective address comprises a segment of said real address.

10. The method as set forth in claim 6 wherein said effective address comprises a first number of bits and said real address comprises a second number of bits, said first number of bits being different from said second number of bits.

11. The method as set forth in claim 10 wherein said first number of bits is smaller than said second number of bits.

12. The method as set forth in claim 11 wherein said effective address comprises a segment of said real address.

13. The method as set forth in claim 1 wherein one of said selectively operable cache functions is performed during each clock cycle of a sequential series of said clock cycles.

14. The method as set forth in claim 1 wherein said selectively operable cache functions include a test function, said test function being effective for testing predetermined aspects of selected ones of said addresses within said real address memory portion of said cache memory.

15. The method as set forth in claim 14 wherein said selectively operable cache functions include a test function, said test function being effective for testing predetermined aspects of selected ones of said addresses within both of said effective address memory portion and said real address memory portion of said cache memory.

16. The method as set forth in claim 1 wherein said selectively operable cache functions includes a refill function, said refill function being effective for writing new data into said cache memory.

17. The method as set forth in claim 16 wherein said refill function is effective for writing new data into said effective address portion of said cache memory.

18. The method as set forth in claim 16 wherein said refill function is effective for writing new data into said real address portion of said cache memory.

19. The method as set forth in claim 16 wherein said method further includes:

determining a least recently used cache line; and writing said new data to said least recently used cache line.

20. The method as set forth in claim 1 wherein said selectively operable cache functions include a block invalidation function, said block invalidation function being effective for selectively invalidating a block of addresses within said cache memory.

21. The method as set forth in claim 20 wherein said block invalidation function is effective for selectively invalidating a block of addresses within said effective address portion of said cache memory.

22. The method as set forth in claim 20 wherein said block invalidation function is effective for selectively invalidating a block of addresses within said real address portion of said cache memory.

23. A cache memory control circuit for operating a cache memory, said cache memory control circuit comprising:

terminal means arranged for receiving input signals including a clock signal, said clock signal being effective for defining sequential clock timing cycles;

mode signal providing means coupled to said terminal means, said mode signal providing means being operable for providing mode signals representative of a plurality of selectively operable cache functions, wherein a selected one of said cache functions is to be completed during a single clock cycle;

circuit means responsive to said mode signals for completing said selected cache function during said single clock cycle;

first comparison circuit for determining whether a first match exists between an input effective address applied to said terminal means and one of a plurality of addresses resident in an effective address portion of said cache memory;

first output signal means for providing a first output signal representative of said first match;

second comparison circuit for determining whether a second match exists between an input real address applied to said terminal means and one of a plurality of addresses resident in a real address portion of said cache memory; and second output signal means for providing a second output signal representative of said second match.

24. The cache memory control circuit of claim 23 wherein said effective address comprises a first number of bits and said real address comprises a second number of bits, said first number of bits being different from said second number of bits.

25. The cache memory control circuit of claim 24 wherein said first number of bits is smaller than said second number of bits.

26. The cache memory control circuit of claim 25 wherein said effective address comprises a segment of said real address.

27. The cache memory control circuit of claim 23 and further including a prefetch circuit for implementing a prefetch cache function, wherein said real address is associated with said prefetch cache function.

28. The cache memory control circuit of claim 27 and further including a look-ahead storage device, wherein said real address is input from said look-ahead storage device, said effective address being related to an address of a current call to said cache memory, said real address being related to an address of a subsequent call to said cache memory.

29. The cache memory control circuit of claim 27 wherein said effective address comprises a first number of bits and said real address comprises a second number of bits, said first number of bits being different from said second number of bits.

30. The cache memory control circuit of claim 29 wherein said first number of bits is smaller than said second number of bits.

31. The cache memory control circuit of claim 30 wherein said effective address comprises a segment of said real address.

32. The cache memory control circuit of claim 28 wherein said effective address comprises a first number of bits and said real address comprises a second number of bits, said first number of bits being different from said second number of bits.

33. The cache memory control circuit of claim 32 wherein said first number of bits is smaller than said second number of bits.

34. The cache memory control circuit of claim 33 wherein said effective address comprises a segment of said real address.

35. The cache memory control circuit of claim 23 wherein one of said selectively operable cache functions is performed during each clock cycle of a sequential series of said clock cycles.

36. The cache memory control circuit of claim 23 and further including a test circuit, wherein said selectively operable cache functions include a test function implemented in said test circuit, said test function being effective for testing predetermined aspects of selected ones of said addresses within said real address memory portion of said cache memory.

37. The cache memory control circuit of claim 36 wherein said test function is effective for testing predetermined aspects of selected ones of said addresses within both of said effective address memory portion and said real address memory portion of said cache memory.

38. The cache memory control circuit of claim 23 and further including a refill circuit, wherein said selectively operable cache functions includes a refill function implemented in said refill circuit, said refill function being effective for writing new data into said cache memory.

39. The cache memory control circuit of claim 38 wherein said refill function is effective for writing new data into said effective address portion of said cache memory.

40. The cache memory control circuit of claim 38 wherein said refill function is effective for writing new data into said real address portion of said cache memory.

41. The cache memory control circuit of claim 38 and further including:

means for determining a least recently used cache line; and a write circuit for writing said new data to said least recently used cache line.

42. The cache memory control circuit of claim 23 and further including a block invalidation circuit, wherein said selectively operable cache functions include a block invalidation function implemented in said block invalidation circuit, said block invalidation function being effective for selectively invalidating a block of addresses within said cache memory.

43. The cache memory control circuit of claim 42 wherein said block invalidation circuit is effective for selectively invalidating a block of addresses within said effective address portion of said cache memory.

44. The cache memory control circuit of claim 42 wherein said block invalidation circuit is effective for selectively invalidating a block of addresses within said real address portion of said cache memory.

* * * * *